United States Patent [19]

Yagi et al.

[11] Patent Number: 4,769,342

[45] Date of Patent: Sep. 6, 1988

[54] METHOD FOR MAKING A SEMICONDUCTOR LASER BY CLEAVING A CANTILEVER HETEROSTRUCTURE

[75] Inventors: Tetsuya Yagi; Hitoshi Kagawa, both of Hyogo, Japan

[73] Assignee: Mitsubishi Denki Kabushiki Kaisha, Tokyo, Japan

[21] Appl. No.: 917,678

[22] Filed: Oct. 10, 1986

[30] Foreign Application Priority Data

Oct. 11, 1985 [JP] Japan .................. 60-227192

[51] Int. Cl.$^4$ .................. H01L 21/208; B01J 17/00
[52] U.S. Cl. .................. 437/129; 437/104; 437/107; 437/126; 437/226; 437/90; 156/610; 156/614; 148/DIG. 26; 148/DIG. 50; 148/DIG. 95; 372/48
[58] Field of Search .............. 148/DIG. 26, 50, 65, 148/56, 72, 99; 156/645, 651, 644, 647, 611-614; 357/16, 17, 55, 56, 45; 372/48, 50, 103; 437/51, 104, 107, 129, 225, 226, 228

[56] References Cited

U.S. PATENT DOCUMENTS

| | | | |
|---|---|---|---|
| 3,959,045 | 5/1976 | Antypas | 437/104 |
| 4,126,931 | 11/1978 | Gandolfi et al. | 437/228 |
| 4,182,025 | 1/1980 | Wickenden | 357/45 |
| 4,236,296 | 12/1980 | Woolhouse et al. | 437/226 |
| 4,237,601 | 12/1980 | Woolhouse et al. | 437/225 |
| 4,276,098 | 6/1981 | Nelson et al. | 437/228 |
| 4,448,797 | 5/1984 | Burnham | 156/613 |
| 4,498,451 | 2/1985 | Beltz et al. | 125/23 R |
| 4,595,454 | 6/1986 | Dautremant-Smith et al. | 437/129 |
| 4,597,003 | 6/1986 | Aine et al. | 156/651 |
| 4,662,988 | 5/1987 | Renner | 357/17 |

OTHER PUBLICATIONS

"Be-Implanted GaAs/GaAlAs Double Heterostructure Strip Geometry Lasers Grown by Metalorganic Chemical Vapor Deposition", H. Shtrikman et al., J. Appl. Phys., 56 (5), Sep. 1, 1984, pp. 1298-1300.

*Primary Examiner*—Brian E. Hearn
*Assistant Examiner*—William Bunch
*Attorney, Agent, or Firm*—Lowe, Price, LeBlanc, Becker & Shur

[57] ABSTRACT

A semiconductor laser device comprises a substrate (7) formed of p type GaAs, a laser diode portion (10) capable of laser oscillation and a monitor photodiode portion (11) capable of photoelectric conversion formed on substrate (7). The laser diode portion (10) and the monitor photodiode portion (11) are both formed of an epitaxial separating layer (6) of p type AlAs, an epitaxial layer group (23) mainly formed of a material of AlGaAs system and an epitaxial window layer (9) formed on a cleavage plane of this epitaxial layer group (23). The cleavage plane of the epitaxial window layer (9) on the side of the laser diode portion (10) constitutes a laser resonator plane (16) for laser light output of said laser diode portion (10) while the cleavage plane of the epitaxial window layer (9) on the monitor photodiode portion (11) constitutes a light receiving plane (17) for receiving the laser light outputted from the laser resonator plane (16).

5 Claims, 7 Drawing Sheets

METHOD FOR MAKING A SEMICONDUCTOR LASER BY CLEAVING A CANTILEVER HETEROSTRUCTURE

BACKGROUND OF THE INVENTION

1. Field of the Invention

The present invention relates to a semiconductor laser device and a method for making the same and, more particularly, it relates to a semiconductor laser device capable of forming a laser resonator plane in the wafer form and a method for making the same.

2. Description of the Prior Art

Conventionally, a laser resonator plane of a semiconductor laser device has been formed by cleaving an epitaxial wafer into laser bars and such method for cleaving is disclosed in "Be-implanted GaAs/GaAlAs Double Heterostructure Stripe Geometry Lasers Grown by Metalorganic Chemical Vapor Deposition" by H. Shtrikman and D. Fekete, J. Appl. Phys. 56, pp 1298-1300, September 1984.

Figure 1A:
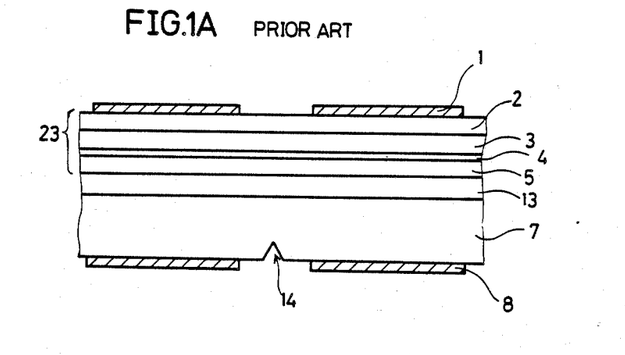
FIGS. 1A and 1B are cross sectional views showing the manufacturing process of a conventional semiconductor laser device.
Figure 1B:
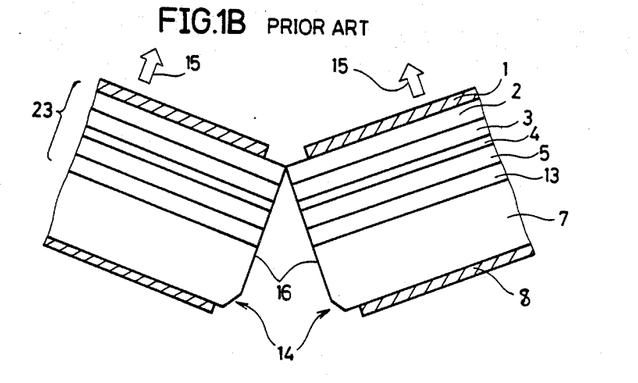

FIGS. 1A and 1B are cross sectional views showing manufacturing process of a conventional semiconductor laser device mainly formed of a material of AlGaAs system for oscillating short wavelength laser.

To start with, a method for making a conventional semiconductor laser device will be described with reference to FIGS. 1A and 1B.

Referring to FIG. 1A, a buffer layer 13 of p type GaAs is grown on a substrate 7 of p type GaAs. Then, an epitaxial layer group 23 in which laser oscillation is possible is grown on the buffer layer 13, thereby obtaining an epitaxial wafer including the substrate 7, buffer layer 13 and the epitaxial layer group 23. This epitaxial layer group 23 comprises a contact layer 2 of n type GaAs, an upper clad layer 3 of n type AlGaAs, an active layer 4 of p type AlGaAs and a lower clad layer 5 of p type AlGaAs, grown in the reverse order from the lower clad layer 5 in manufacturing. Then, an n side electrode 1 is formed on the upper surface of the epitaxial wafer while a p side electrode 8 is formed on the lower surface thereof. A mesa groove 14 for cleavage is formed on the lower surface of the substrate 7.

Referring to FIG. 1B, the epitaxial wafer is cleft along the mesa groove 14 by applying force to the epitaxial wafer in the direction of an arrow 15 in the figure. The cleavage plane obtained from this cleavage forms a laser resonator plane 16 for outputting laser light.

Several methods are known for forming such cleavage plane. For example, applying force by pinching the epitaxial wafer with a pair of tweesers or applying force to the wafer surface opposite to the mesa groove 14 with a sharp edged tool such as a surgical knife has been known as a typical method.

The operation of the semiconductor laser device shown in FIG. 1B will be hereinafter described. In FIG. 1B, when a forward voltage is applied between the n side electrode 1 and the p side electrode 8, a current flows between both electrodes 1 and 8 implanting minority carriers into the active layer 4. Consequently, laser oscillation is performed and laser light is outputted from the laser resonator plane 16.

However, in a conventional semiconductor laser device manufactured according to the above described method, the semiconductor laser device is in the shape of a bar after the formation of the laser resonator plane, as shown in FIG. 1B, presenting a problem that the handling thereof is troublesome.

Since the process for forming the laser resonator plane as shown in FIG. 1B depends on skilled workers, there is a problem that the efficiency in working is low.

In addition, in incorporating the semiconductor laser device into various machines, a photodiode for monitoring laser light output must be provided at the back of the semiconductor laser device generally; however, in a conventional semiconductor laser device as described above, the photodiode is not intergrated on the same substrate with the result, so that there is a problem that the semiconductor laser device and the photodiode must be separately incorporated.

SUMMARY OF THE INVENTION

Briefly described, the present invention is directed to a semiconductor laser device comprising a semiconductor substrate, an epitaxial separating layer formed on said semiconductor substrate and an epitaxial layer group formed on said epitaxial separating layer, the epitaxial layer group having a cleavage plane forming a laser resonator plane for outputting laser light.

According to another aspect of the present invention, the semiconductor laser device comprises a semiconductor substrate, an epitaxial separating layer formed on said semiconductor substrate, an epitaxial layer group formed on the epitaxial separating layer and having a cleavage plane, and an epitaxial window layer formed on the cleavage plane of the epitaxial layer group, the epitaxial window layer having a cleavage plane forming a laser resonator plane for outputting laser light.

According to still another aspect of the present invention, the semiconductor laser device comprises a semiconductor substrate, and a laser diode portion and a monitor photodiode portion formed on the semiconductor substrate; these laser diode portion and monitor photodiode portion being both composed of an epitaxial separating layer and an epitaxial layer group; wherein the epitaxial layer group on the side of the laser diode portion has a cleavage plane forming a laser resonator plane for outputting laser light while the epitaxial layer group on the side of the monitor photodiode portion has a cleavage plane forming a light receiving plane for receiving the laser light.

According to yet another aspect of the present invention, the semiconductor laser device comprises a semiconductor substrate, a laser diode portion and a monitor photodiode portion formed on the semiconductor substrate; the laser diode portion and the monitor photodiode portion being both composed of an epitaxial separating layer, an epitaxial layer group and an epitaxial window layer formed on the cleavage plane of the epitaxial layer group; wherein the epitaxial window layer on the side of the laser diode portion has a cleavage plane forming a laser resonator plane for outputting laser light while the epitaxial window layer on the side of the monitor photodiode has a cleavage plane forming a light receiving plane for receiving the laser light.

According to still another aspect of the present invention, a method for making a semiconductor laser device comprises the steps of preparing a semiconductor substrate, forming an epitaxial separating layer on the semiconductor substrate, forming an epitaxial layer group on the epitaxial separating layer, forming a cantilever structure of the epitaxial layer group by selectively carve-etching the epitaxial separating layer and forming a cleavage plane constituting the laser resonator plane by snapping off the cantilever structure with pressure.

According to another aspect of the present invention, a method for making the semiconductor laser device comprises the steps of preparing a semiconductor substrate, forming an epitaxial separating layer on the semiconductor substrate, forming an epitaxial layer group on the epitaxial separating layer, forming a first cantilever structure of the epitaxial layer group by selectively carve-etching the epitaxial separating layer, forming a cleavage plane of the epitaxial layer group by snapping off the first cantilever structure with pressure, forming an epitaxial window layer on the wall surface of the epitaxial layer group, forming a second cantilever structure of the epitaxial window layer by selectively carve-etching the epitaxial separating layer and forming a cleavage plane constituting a laser resonator plane by snapping off the second cantilever structure with pressure.

According to still another aspect of the present invention, a method for making the semiconductor laser device comprises the steps of preparing a semiconductor substrate, forming an epitaxial separating layer on the semiconductor substrate, forming an epitaxial layer group on the epitaxial separating layer, separating the epitaxial layer group into two regions by partially removing the epitaxial layer group by etching, forming a pair of cantilever structure of the epitaxial layer group by selectively under-etching the epitaxial separating layer and forming a pair of cleavage plane, one of which constituting a laser resonator plane and the other constituting a light receiving plane, by snapping off the pair of cantilever structure with pressure.

According to still another aspect of the present invention, a method for making a semiconductor laser device comprises the steps of preparing a semiconductor substrate, forming an epitaxial separating layer on the semiconductor substrate, forming an epitaxial layer group on the epitaxial separating layer, separating the epitaxial layer group into two regions by partially removing the epitaxial layer group by etching, forming a first pair of cantilever structure of the epitaxial layer group by selectively under-etching the epitaxial separating layer, forming a pair of cleavage plane of the epitaxial layer group by snapping off the first pair of cantilever structure with pressure, forming an epitaxial window layer on the pair of the cleavage plane, forming a second pair of cantilever structure of the epitaxial window layer by selectively under-etching the epitaxial separating layer and forming a pair of cleavege plane, one of which constituting a laser resonator plane and the other constituting a light receiving plane, by snapping off the second pair of cantilever structure with pressure.

Therefore, it is a main object of the present invention to provide a semiconductor laser device formed in the wafer form and which is readily handled.

It is another object of the present invention to provide a method for making a semiconductor laser device with improved working efficiency in manufacturing.

It is still another object of the present invention to provide a semiconductor laser device and the method for making the same, in which the laser diode portion and the monitor photodiode portion are integrated in a single chip.

It is another object of the present invention to provide a high output semiconductor laser device and the method for making the same.

It is a main advantage of the present invention that a semiconductor laser device can be easily manufactured while maintaining a wafer form since an epitaxial separating layer is provided between the semiconductor substrate and the epitaxial layer group.

It is another advantage of the present invention that a laser resonator plane can be easily formed without dividing the semiconductor substrate since a cantilever structure of the epitaxial layer group is formed by selectively under-etching the epitaxial separating layer.

It is another advantage of the present invention that a high output semiconductor laser device can be obtained by forming an epitaxial window layer of a material having wider forbidden band gap and making the cleavage plane thereof work as a laser resonator plane.

It is still another advantage of the present invention that the laser diode portion and the monitor photodiode portion can be integrated on a single chip since the epitaxial layer group is separated into the laser diode portion and the monitor photodiode portion for making one cleavage plane serve as a laser resonator plane and the other cleavage plane serve as a light receiving plane of the laser light.

These objects and other objects, features, aspects and advantages of the present invention will become more apparent from the following detailed description of the present invention when taken in conjunction with the accompanying drawings.

DESCRIPTION OF THE PREFERRED EMBODIMENTS

Figure 2:
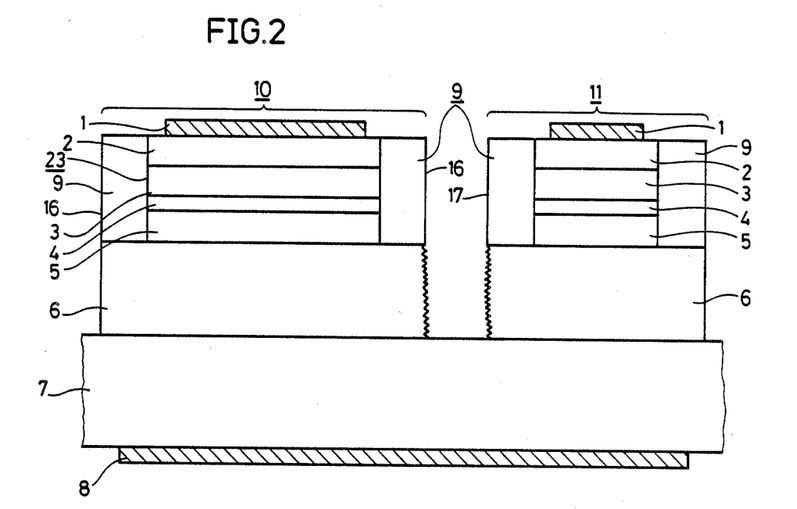
FIG. 2 is a cross sectional view showing a semiconductor laser device according to one embodiment of the present invention.

FIG. 2 is a cross sectional view showing a semiconductor laser device according to one embodiment of the present invention.

The structure of a semiconductor laser device according to one embodiment of the present invention will be hereinafter described with reference to FIG. 2. In FIG. 2, a laser diode portion 10 and a monitor photodiode portion 11 are formed on a substrate 7 of p type GaAs. The laser diode portion 10 and the monitor photodiode portion 11 both have the same structure and each composed of a relatively thick epitaxial separating layer 6 of p type AlAs and an epitaxial layer group 23. As is the same in a conventional semiconductor laser device shown in FIG. 1, the epitaxial layer group 23 comprises a contact layer 2 of n type GaAs, an upper clad layer 3 of n type AlGaAs, and active layer 4 of p type AlGaAs and a lower clad layer 5 of p type AlGaAs and, an epitaxial window layer 9 of InGaP is formed on the cleavage plane of the epitaxial layer group 23. The cleavage plane of the epitaxial window layer 9 on the side of the laser diode portion 10 forms a laser resonator plane 16 for outputting laser light while the cleavage plane of the epitaxial window layer 9 on the side of the monitor photodiode portion 11 forms a light receiving plane 17 for receiving the laser light. An n side electrode 1 is formed on the upper surface of the laser diode portion 10 and the monitor photodiode portion 11 while a p side electrode 8 is formed on the lower surface of the substrate 7.

Figure 3:
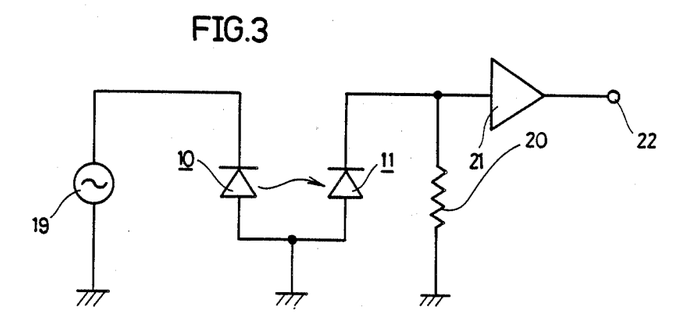
FIG. 3 is a schematic diagram of an equivalent circuit of the semiconductor laser device according to one embodiment of the present invention shown in FIG. 2.

FIG. 3 is a schematic diagram of an equivalent circuit of the semiconductor laser device according to one embodiment of the present invention shown in FIG. 2.

The operation of the semiconductor laser device according to one embodiment of the present invention will be described with reference to FIGS. 2 and 3. The operation of the laser diode portion 10 is almost the same as that of a conventional semiconductor laser device shown in FIGs. 1A and 1B. Namely, in the laser diode portion 10, laser oscillation is generated at the epitaxial layer group 23 in response to the signal voltage applied from the laser driving signal source 19. More specifically, in the semiconductor laser device according to one embodiment of the present invention shown in FIG. 2, higher output can be obtained compared with a conventional semiconductor laser device shown in FIG. 1B since an epitaxial window layer 9 of InGaP having wider forbidden band gap than the active layer 4 is formed by epitaxial growth and the cleavage plane thereof is made for laser resonator plane.

On the other hand, the monitor photodiode portion 11 functions in such a manner that it receives the laser light radiated from the laser diode portion 10 through a light receiving plane 17 and converts the received light into an electric signal by photoelectric conversion. Namely, as is apparent from FIG. 2, the structure of the monitor photodiode portion 11 is basically the same as that of the laser diode portion 10. However, as is shown in the equivalent circuit of FIG. 3, the monitor photodiode portion 11 is structured such that it senses the laser light output from the laser diode portion 10 and outputs a laser light output monitor voltage signal through a voltage amplifier 21 and an output terminal 22.

FIGS. 4A to 4H are cross sectional views showing main process steps of the manufacturing method of the semiconductor laser device according to one embodiment of the present invention.

The method for making the semiconductor laser device according to one embodiment of the present invention will be hereinafter described with reference to FIGS. 4A to 4H.

Figure 4A:
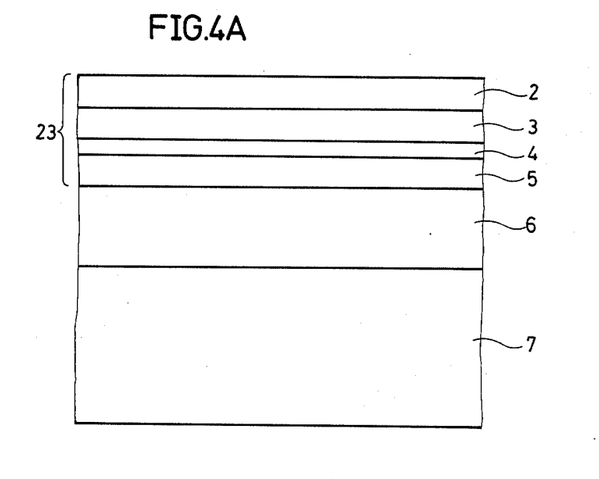
FIGS. 4A to 4H are cross sectional views showing main process steps of the method for making the semiconductor laser device according to one embodiment of the present invention.

Referring to FIG. 4A, a thick epitaxial separating layer 6 of p type AlAs is formed on a substrate 7 of p type GaAs, and then an epitaxial layer group 23 capable of laser oscillation and photoelectric conversion is formed on the epitaxial separating layer 6. The substrate 7, the epitaxial separating layer 6 and the epitaxial layer group 23 form an epitaxial wafer.

Figure 4B:
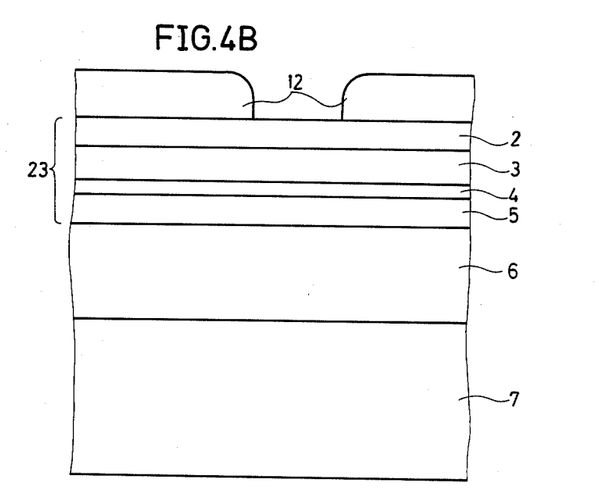

Referring to FIG. 4B, a resist 12 is formed by photolithographic process to cover the upper surface of the epitaxial wafer except the portion adjacent to the portion where a laser resonator plane will be formed.

Figure 4C:
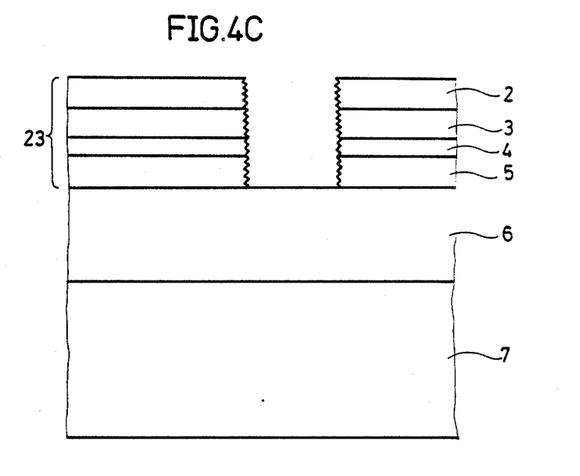

Referring to FIG. 4C, the epitaxial layer group 23 is partially removed by etching using the aforementioned resist 12 as a mask. On this occasion, the etching need not be stopped at the upper surface of the epitaxial separating layer 6 and the epitaxial separating layer 6 may be etched to some extent.

Figure 4D:
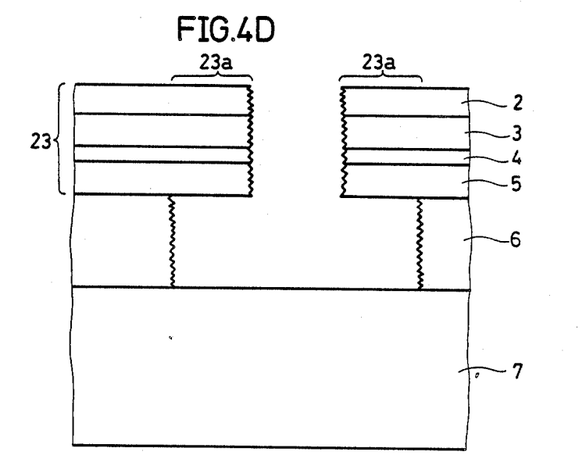

Referring to FIG. 4D, the epitaxial separating layer 6 of AlAs is selectively under-etched by an etchant of hydrofluoric acid (HF) system so as to form a pair of cantilever structure 23a of the epitaxial layer group 23.

Figure 4E:
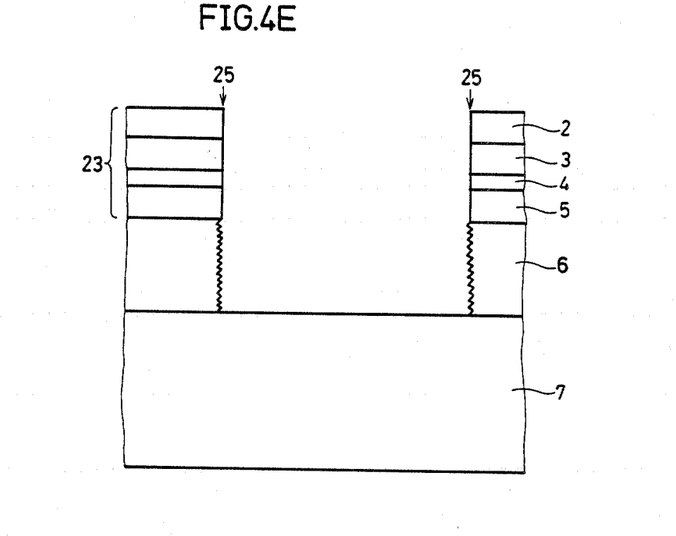

Referring to FIG. 4E, the cantilever structure 23a is snapped off by applying pressure from the upper surface of the wafer by a pure water spray and the like so that a pair of cleavage planes 25 are formed.

Figure 4F:
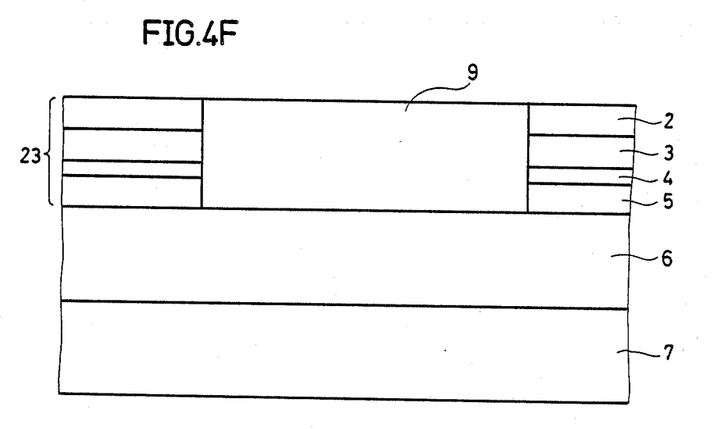

Referring to FIG. 4F, the epitaxial separating layer 6 is once again grown in the portion where the epitaxial separating layer 6 is removed by the aforementioned under-etching and, in addition, an epitaxial window layer 9 is grown on the cleavage plane of the epitaxial layer group 23.

Figure 4G:
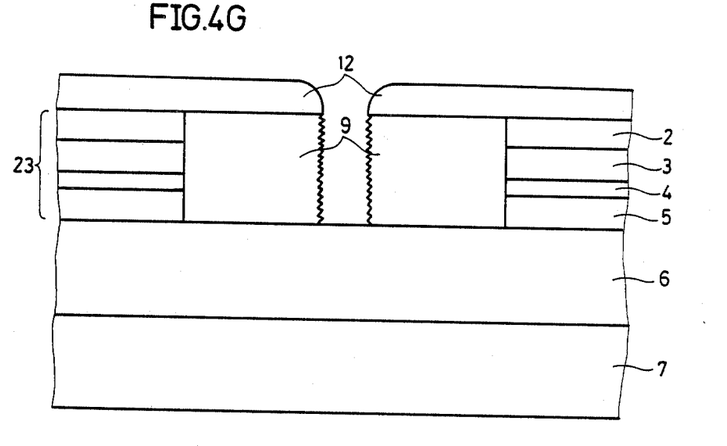

Referring to FIG. 4G, a resist 12 is formed on the upper surface of the epitaxial wafer using photolithographic process except the portion adjacent to the portion where the laser resonator plane will be formed, and then the epitaxial window layer 9 is partially removed by etching using the resist 12 as a mask.

Figure 4H:
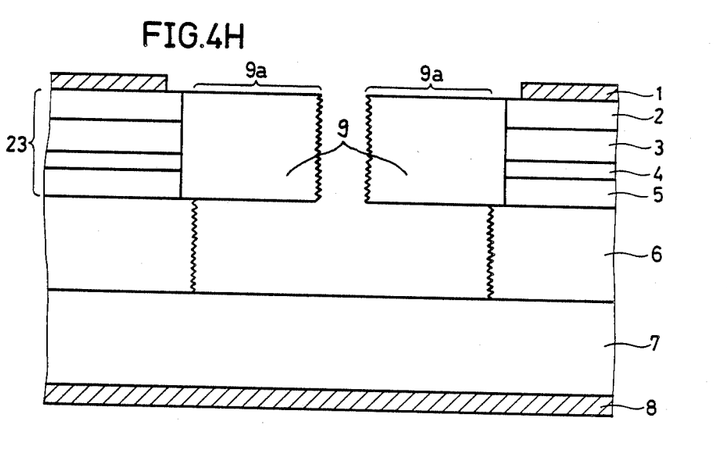

Referring to FIG. 4H, an n side electrode 1 and a p side electrode 8 are formed, and thereafter only the epitaxial separating layer 6 is again selectively under-etched by an etchant such as hydrofluoric acid to form a pair of cantilever structure 9a of the epitaxial window layer 9. Then the cantilever structure 9a is snapped off by applying pressure on the upper surface of the wafer by a pure water spray and the like forming a pair of cleavage plane on the epitaxial window layer 9. Thus the laser resonator plane 16 and a light receiving plane 17 shown in FIG. 2 are formed.

During the epitaxial growth shown in FIG. 4F, a MBE (Molecular Beam Epitaxy) method is preferred since no crystal should be grown on the cleavage plane 25 of the epitaxial layer group 23.

Figure 5:
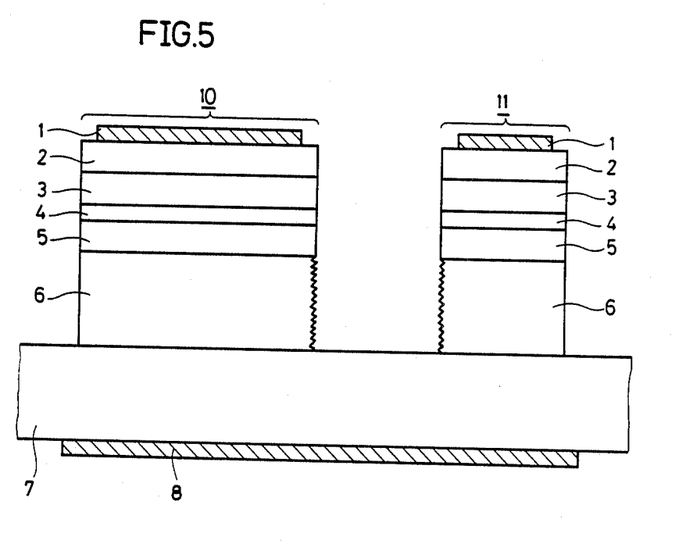
FIG. 5 is a cross sectional view showing a semiconductor laser device according to another embodiment of the present invention.

FIG. 5 is a cross sectional view showing a semiconductor laser device according to another embodiment of the present invention. The embodiment shown in FIG. 5 is the same as the above described embodiment shown in FIG. 2 except that the epitaxial window layer 9 is not provided. Namely, if a high output is not required, there is no need to provide an epitaxial window layer 9 shown in FIG. 2. In the embodiment shown in FIG. 5, the cantilever structure should be formed only one time during the manufacturing process and the growth of the epitaxial window layer becomes unnecessary, so that it is advantageous in reducing the whole process steps.

Figure 6:
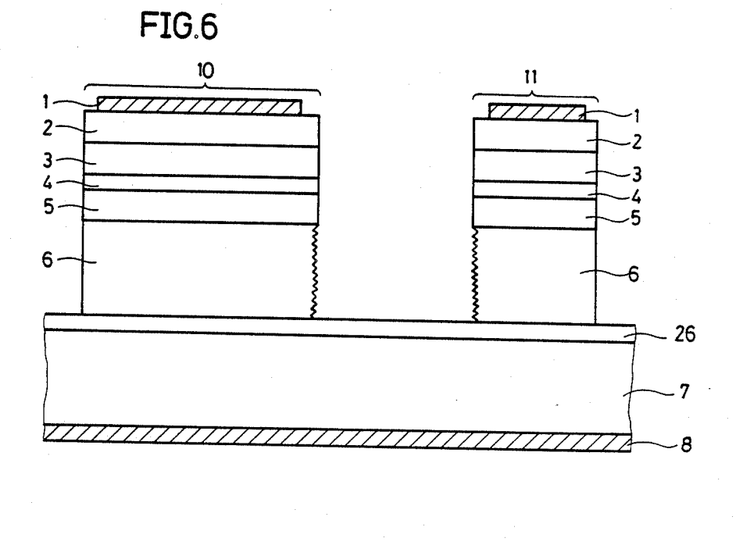
FIG. 6 is a cross sectional view showing a semiconductor laser device according to still another embodiment of the present invention.

FIG. 6 is a cross sectional view showing a semiconductor laser device according to still another embodiment of the present invention. Although a short wavelength laser device using a material of AlGaAs system as the epitaxial layer group and AlAs as the epitaxial separating layer is described in the embodiment of FIG. 2, a long wavelength laser can be structured by using a material of InGaAsP system as the epitaxial layer group and InP as the epitaxial separating layer. In order to form a long wavelength laser of InGaAsP system, a p type InGaAs etching block layer 26 need be provided between the substrate 7 and the epitaxial separating layer 6.

Although the laser diode portion 10 and the monitor photodiode portion 11 are provided next to each other on a single chip in the above described embodiment, the same manufacturing process as in the above embodiment can be applied in the case where only the laser diode portion 10 is formed.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method for manufacturing a semiconductor laser device comprising the steps of
    preparing a semiconductor substrate,
    forming an epitaxial separating layer on said semiconductor substrate,
    successively forming an epitaxial layer group for generating laser oscillation therein in response to an externally applied voltage on said epitaxial separating layer,
    forming a cantilever structure formed of said epitaxial layer group by selectively under-etching said epitaxial separating layer, and
    forming a cleavage plane of said epitaxial layer group by snapping off said cantilever structure with pressure, wherein said cleavage plane forms a laser resonator plane for outputting laser light generated by said laser oscillation.

2. A method for manufacturing a semiconductor laser device according to claim 1, wherein
    said epitaxial separating layer is formed of a material of AlAs system,
    said epitaxial layer group comprises a layer formed of a material of AlGaAs system, and
    the under-etching of said epitaxial separating layer is carried out using an etchant of hydrofluoric acid system.

3. A method for manufacturing a semiconductor laser device according to claim 1, wherein
    said epitaxial separating layer is formed of a material of InP system,
    said epitaxial layer group comprises a layer formed of a material of InGaAsP system, and
    the carve-etching of said epitaxial separating layer is carried out using an etchant of hydrochloric acid system.

4. A method as recited in claim 1, wherein said step of forming a cleavage plane comprises forming a pair of cleavage planes.

5. A method as recited in claim 4, wherein said step of forming a pair of cleavage planes comprises the step of forming a laser resonator plane and a light receiving plane.

* * * * *